United States Patent
Tong

(10) Patent No.: US 11,268,311 B1
(45) Date of Patent: Mar. 8, 2022

(54) FLUSH MOUNT TELESCOPING STRAIGHT ANGLE PANEL-HINGE SYSTEM FOR CONTAINER

(71) Applicant: Seagate Technology LLC, Cupertino, CA (US)

(72) Inventor: Ryan Christopher Tong, Hercules, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 391 days.

(21) Appl. No.: 16/369,664

(22) Filed: Mar. 29, 2019

Related U.S. Application Data

(60) Provisional application No. 62/650,789, filed on Mar. 30, 2018.

(51) Int. Cl.
| | |
|---|---|
| E05D 7/10 | (2006.01) |
| E05D 7/04 | (2006.01) |
| G06F 1/16 | (2006.01) |
| H05K 5/03 | (2006.01) |
| B65D 43/16 | (2006.01) |
| B65D 43/26 | (2006.01) |
| B65D 43/22 | (2006.01) |
| B65D 43/24 | (2006.01) |

(52) U.S. Cl.
CPC .............. *E05D 7/04* (2013.01); *B65D 43/161* (2013.01); *B65D 43/167* (2013.01); *B65D 43/26* (2013.01); *G06F 1/1628* (2013.01); *G06F 1/1637* (2013.01); *G06F 1/1656* (2013.01); *H05K 5/03* (2013.01); *B65D 43/22* (2013.01); *B65D 43/24* (2013.01); *B65D 2543/00444* (2013.01); *E05D 2007/0469* (2013.01)

(58) Field of Classification Search
CPC ................. B65D 43/16; B65D 43/161; B65D 43/163–167; G06F 1/1628; G06F 1/1637; G06F 1/1641; G06F 1/1679; G06F 1/1681; A45C 2011/003; E05D 3/06; E05D 7/04; H05K 5/0239
USPC ................. 206/320; 220/662–664, 602, 810, 220/817–818, 820–821, 843–845, 848, 220/258.1, 258.2
See application file for complete search history.

(56) References Cited

U.S. PATENT DOCUMENTS

| | | | |
|---|---|---|---|
| 5,337,911 A * | 8/1994 | Holub | A45C 11/20 220/254.3 |
| 5,433,046 A | 7/1995 | MacQuarrie et al. | |
| 5,555,157 A * | 9/1996 | Moller | G06F 1/1626 312/223.2 |

(Continued)

*Primary Examiner* — Robert Poon
(74) *Attorney, Agent, or Firm* — Westman, Champlin & Koehler, P.A.

(57) ABSTRACT

A container includes a main body having a first outer surface and a panel rotatably mounted to the main body. The panel has a second outer surface which is substantially flush with the first outer surface of the main body when the panel is in a closed position. The container further includes a rotation mechanism that enables rotational movement of the panel between the closed position and a fully open position in which the second outer surface of the panel is in contact with the first outer surface of the main body. The rotational movement is enabled via a mid-rotation telescoping component that is configured to enable movement of the panel away from the first outer surface of the main body.

20 Claims, 10 Drawing Sheets

(56) References Cited

U.S. PATENT DOCUMENTS

| | | | |
|---|---|---|---|
| 6,315,154 B1* | 11/2001 | Newby, Sr. | B65D 43/165 |
| | | | 16/380 |
| 6,556,138 B1 | 4/2003 | Sliva et al. | |
| 6,995,353 B2 | 2/2006 | Beinhocker | |
| 9,302,812 B2 | 4/2016 | Rees et al. | |
| 9,718,299 B2 | 8/2017 | Dawson et al. | |
| 9,809,356 B2* | 11/2017 | Kissner | B65D 43/0212 |
| 10,166,928 B2 | 1/2019 | Loew | |
| 2002/0162190 A1 | 11/2002 | Spork et al. | |
| 2011/0085297 A1 | 4/2011 | Wright-Johnson et al. | |
| 2014/0069919 A1* | 3/2014 | Robert | B29D 99/0096 |
| | | | 220/258.2 |
| 2017/0066575 A1* | 3/2017 | Leopold | B65D 43/22 |
| 2018/0016826 A1* | 1/2018 | Tsou | E05D 3/02 |

* cited by examiner

US 11,268,311 B1

FLUSH MOUNT TELESCOPING STRAIGHT ANGLE PANEL-HINGE SYSTEM FOR CONTAINER

CROSS-REFERENCE TO RELATED APPLICATIONS

This application is a non-provisional application of U.S. Provisional Application No. 62/650,789, filed on Mar. 30, 2018, the content of which is hereby incorporated in its entirety.

SUMMARY

In one embodiment, a container is provided. The container includes a main body having a first outer surface and a panel rotatably mounted to the main body. The panel has a second outer surface which is substantially flush with the first outer surface of the main body when the panel is in a closed position. The container further includes a rotation mechanism that enables rotational movement of the panel between the closed position and a fully open position in which the second outer surface of the panel is in contact with the first outer surface of the main body. The rotational movement is enabled via a mid-rotation telescoping component that is configured to enable movement of the panel away from the first outer surface of the main body.

In another embodiment, a method is provided. The method includes placing a panel in a closed position over a display that is recessed below a first outer surface of a main body of a container such that a second outer surface of the panel is flush with the first outer surface of the main body. The method also includes opening the panel via rotation to about a 90 degree position from the closed position. The method further includes telescoping the panel away from the first outer surface of the main body to allow rotation of the panel to a full 180 degrees from the closed position.

In yet another embodiment, a container is provided. The container includes a main body having a first outer surface and a panel rotatably mounted to the main body. The panel has a second outer surface. The container further includes a rotation mechanism that enables rotational movement of the panel between a closed position in which the panel covers a recess or an opening in the container and a fully open position in which the second outer surface of the panel is in contact with the first outer surface of the main body. The rotational movement is enabled via a mid-rotation telescoping component that is configured to enable movement the panel away from the first outer surface of the main body.

Other features and benefits that characterize embodiments of the disclosure will be apparent upon reading the following detailed description and review of the associated drawings.

DETAILED DESCRIPTION OF ILLUSTRATIVE EMBODIMENTS

Containers may have hinged panels that rotate open and closed. The panel may lay substantially flush with the surface of the container to which it is mounted. Generally, it is desirable from a product design, aesthetic, and user experience-standpoint to maintain a substantially completely flat surface for the container. When the enclosure is used for shipping, this flat surface may reduce the likelihood of the enclosure getting caught on logistics systems such as conveyor belts and the like. However, the axis of rotation of the flush panel is below the outer surface of the container and therefore the container acts as a hard stop limiting the panel from rotating open far enough to be completely "out of the way" for the end user. A panel in the open position may typically be between 90 and 170 degrees from closed, which poses a potential breakage hazard. Recesses designed into the enclosure body or hinges that protrude above the surface of the enclosure can be implemented to address these issues. Both of these approaches, however, result in an enclosure surface that is not flat when the panel is closed.

To address the above problems, embodiments of the disclosure provide a container having a panel capable of rotating far enough so that it lies flat with the container body when opened. The panel also creates a flat container surface when it is closed.

Figure 1:
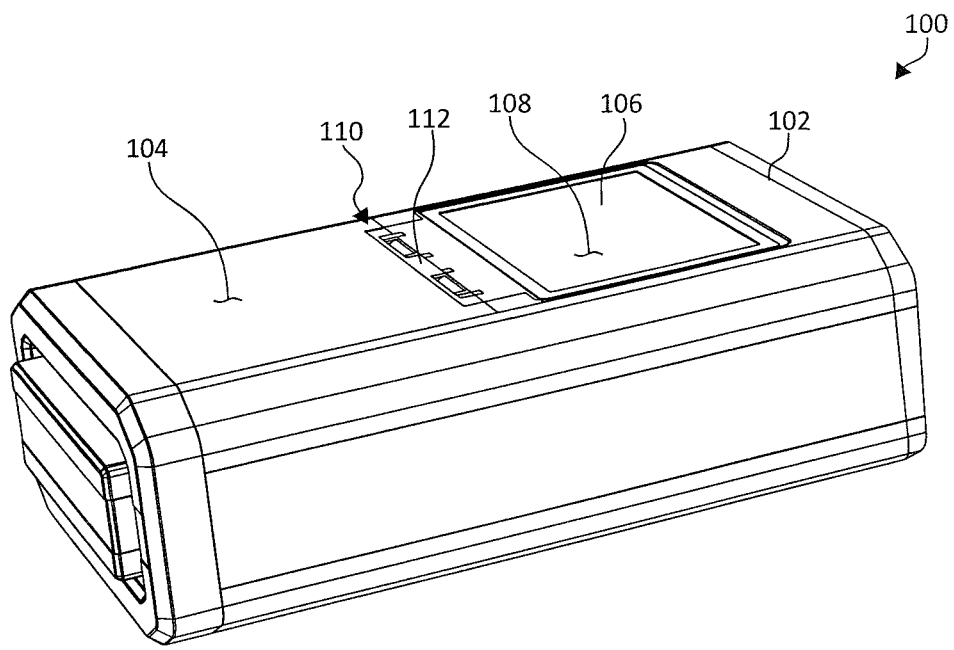
FIG. 1 is a diagrammatic illustration of a container in accordance with one embodiment.

FIG. 1 is a diagrammatic illustration of a container in which in which at least some of embodiments disclosed herein may be incorporated. The container shown in FIG. 1 is for illustration purposes only. Embodiments of the present disclosure are not limited to any particular container such as the container shown in FIG. 1. Embodiments of the present disclosure are illustratively practiced within any number of different types of containers.

It should be noted that like reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

FIG. 1 is a diagrammatic illustration showing a container 100 having a panel that can be rotated to a fully opened position that is 180 degrees from a closed position. Container 100 may be of any suitable shape and includes a main body 102, which has a first outer surface 104. Container 100 also includes a panel 106 that is rotatably mounted to the main body 102. Panel 106 has a second outer surface 108, which is substantially flush with the first outer surface 104 of the main body 102 when the panel 106 is in a closed position shown in FIG. 1. As can be seen in FIG. 1, panel 106 is coupled to main body 102 by a rotation mechanism (e.g., a hinge structure) 110 that includes a hinge base 112. As will be described further below, the hinge structure 110 enables rotation of the panel 106 to a fully opened position that is 180 degrees from the closed positon shown in FIG. 1.

Figure 2:
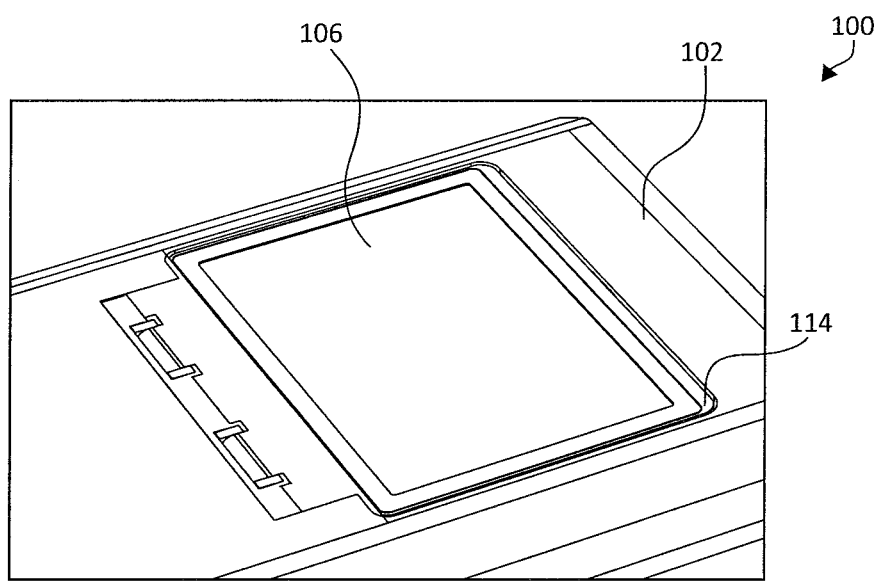
FIG. 2 is a diagrammatic illustration of a portion of a container in accordance with one embodiment.

FIG. 2 is a diagrammatic illustration of a portion of container 100 of FIG. 1. As can be seen in FIG. 2, main body 102 of container 100 includes a recess or opening 114 sized to receive panel 106. In some embodiments, a depth of recess 114 corresponds to a thickness of panel 102. In general, panel 106 may be formed of any suitable material.

Figure 3:
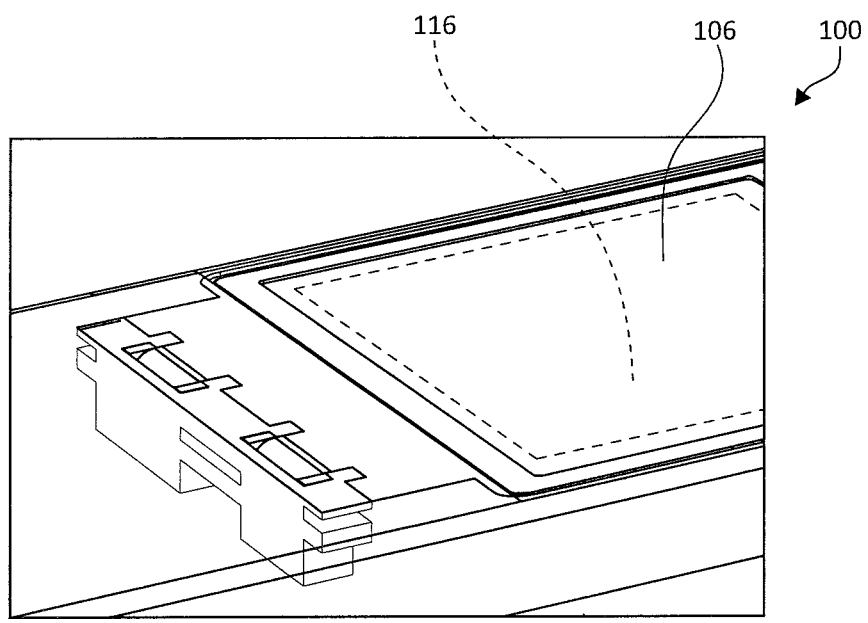
FIG. 3 is a diagrammatic illustration of a portion of a container having an electronic display or label in accordance with one embodiment.

In some embodiments, container 100 may include a recessed display, such as an electronic display or shipping label that may have a user touch interface. On such embodiment is shown in FIG. 3 in which the recessed display or label is denoted by reference numeral 116. In such an embodiment, panel 106 may be formed of a transparent or semi-transparent material, which allows visual inspection of the underlying electronic display or label 116 while protecting the electronic display 116 from damage during shipping or other supply chain handling. Panel 106 may also help keep out water, dust, or other contaminants from the electronic display 116. In certain embodiments, instead of having the entire panel 106 transparent or semi-transparent, the panel 106 may include a see through window that is substantially flush with the rest of the second outer surface 108 of the panel 106.

Figure 4A:
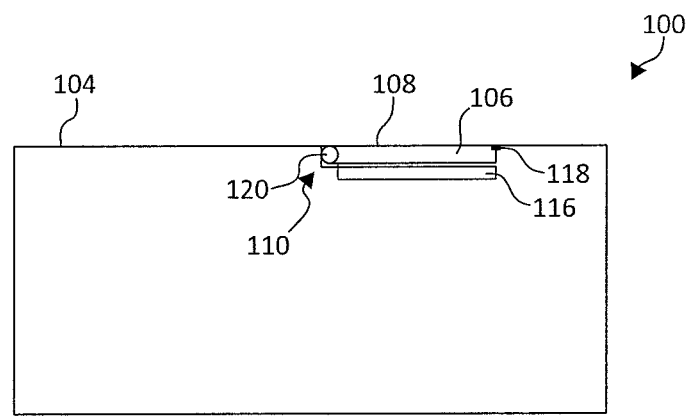
FIGS. 4A, 4B and 4C are schematic side views of a container in accordance with one embodiment.
Figure 4B:
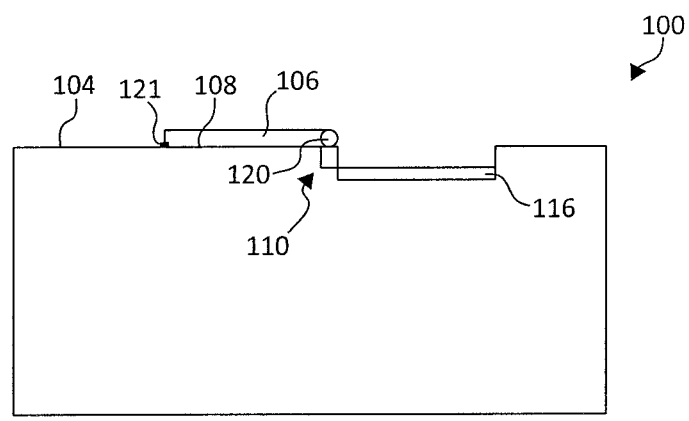
Figure 4C:
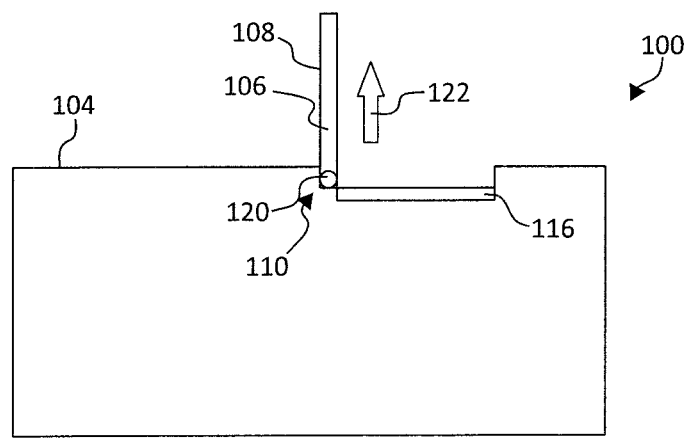

FIGS. 4A, 4B and 4C are schematic side views of container 100 showing closed, open and mid-rotation positions, respectively, of panel 106. FIG. 4A shows panel 106 in a closed position with a latch 118 holding the panel 106 in place over electronic display or label 116. It should be noted that latch 118 is optional and therefore may not be included in certain embodiments. FIG. 4B shows panel 106 rotated to a fully open position, which is 180 degrees from the closed position. Panel 106 may be latched in the fully opened position by an optional latch 121. To enable rotational movement of panel 106 from the closed position of FIG. 4A to the fully opened position of FIG. 4B, in some embodiments, an axis of rotation 120 of panel 106 is raised above the first outer surface 104 of the main body 102 with the help of a mid-rotation telescoping component of rotation mechanism 110. The raising of the axis of rotation 120 of panel 106 is shown by arrow 122. When the axis of rotation 120 is raised above the first outer surface 104 as shown in FIG. 4C, the main body 102 does not limit the panel 106 from rotating to the fully open position shown in FIG. 4B.

Figure 5A:
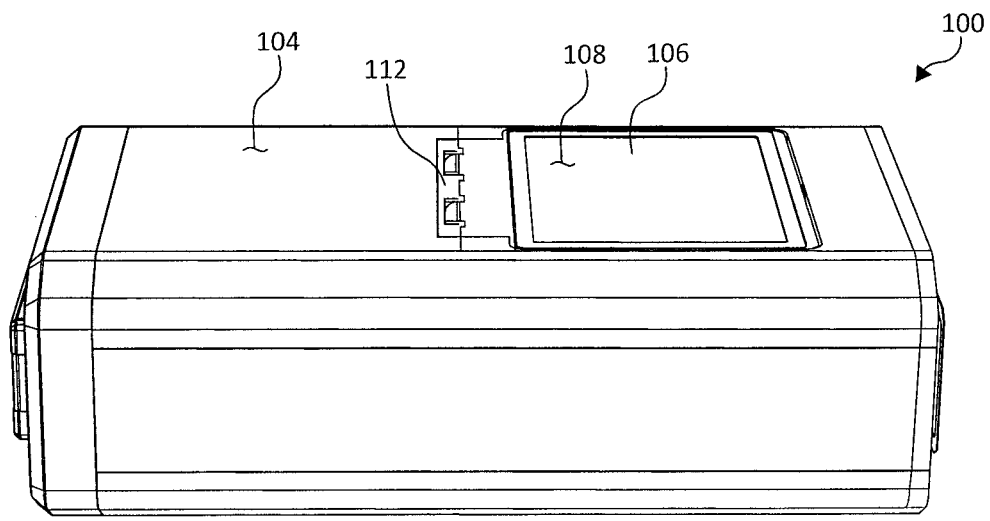
FIGS. 5A, 5B and 5C are perspective views of a container in accordance with one embodiment.
Figure 5B:
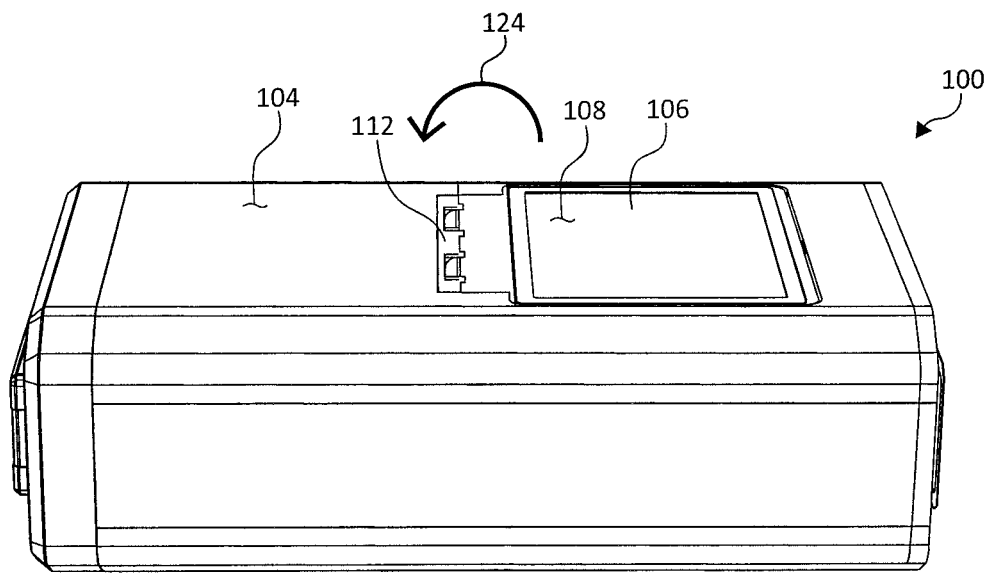
Figure 5C:
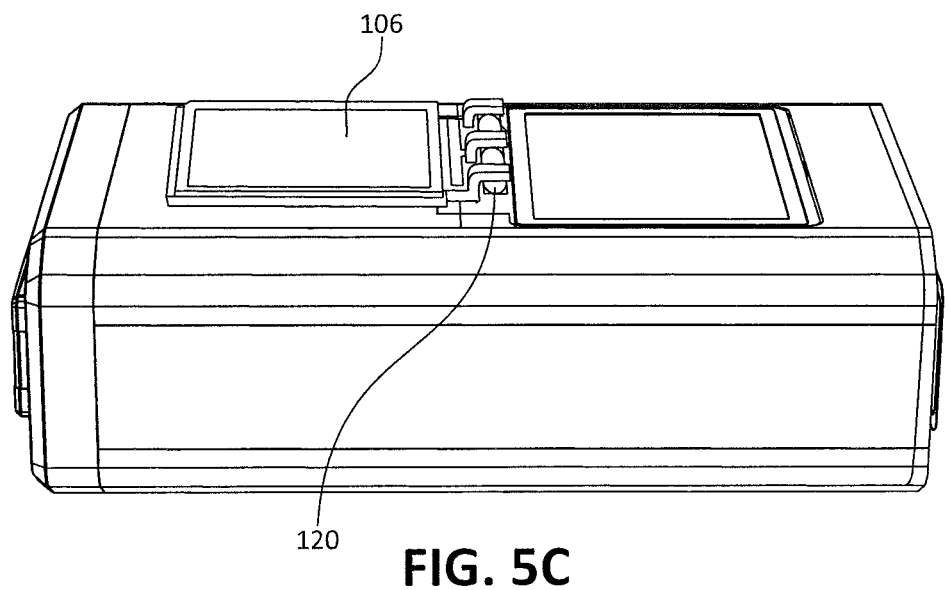

FIGS. 5A and 5B are perspective views of container 100 with panel 106 in a closed positon, and FIG. 5C is a perspective view of panel 106 in an open position. As indicated above, when in the closed position, the panel 106, hinge base 112, and all related components lie flush with the first outer surface 104 of main body 102. Catches may be integrated into the panel 106 structure to aid in keeping the panel 106 closed. Other components such as latches (e.g., 118 shown in FIG. 4A), detents, locks, and/or padding may also be incorporated to further aid in keeping the panel closed. FIG. 5B shows a direction of rotation 124 for opening panel 106, and FIG. 5C shows panel 106 in a fully opened position. As can be seen in FIG. 5C, in the fully open position, the axis of rotation 120 of panel 106 is above the first outer surface 104 of main body 102 of container 100.

Figure 6C:
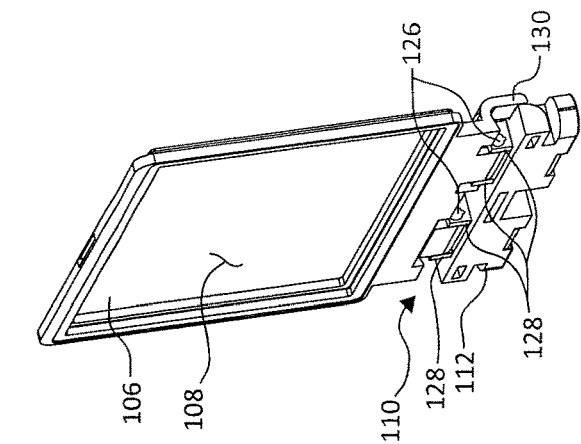
FIGS. 6A-6E are diagrammatic illustrations of a panel in different rotational positions.
Figure 6B:
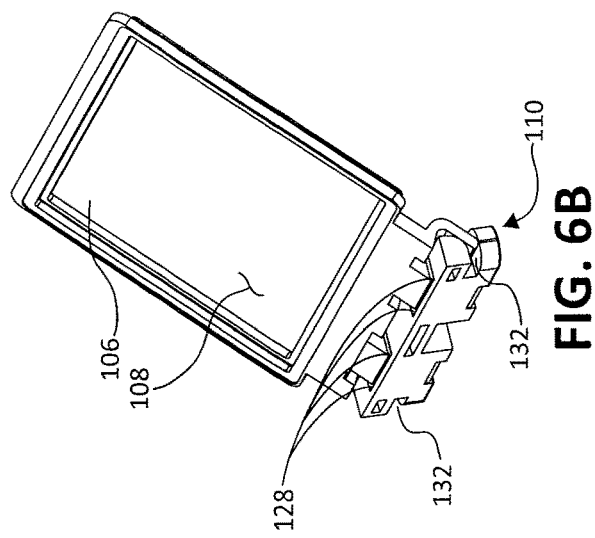
Figure 6A:
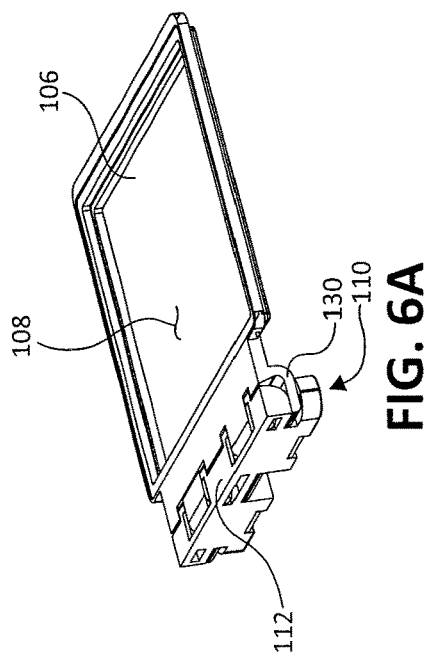
Figure 6D:
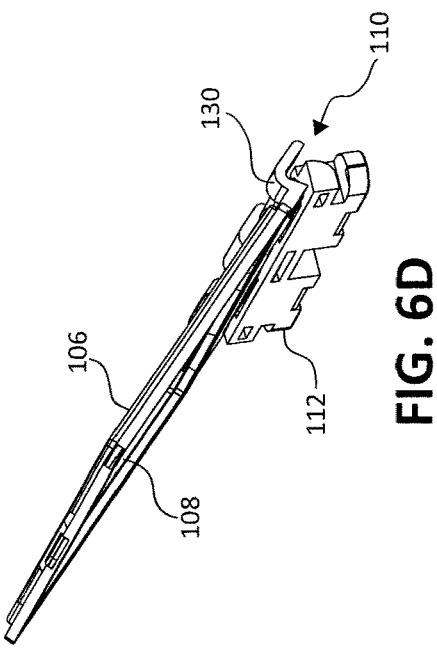
Figure 6E:
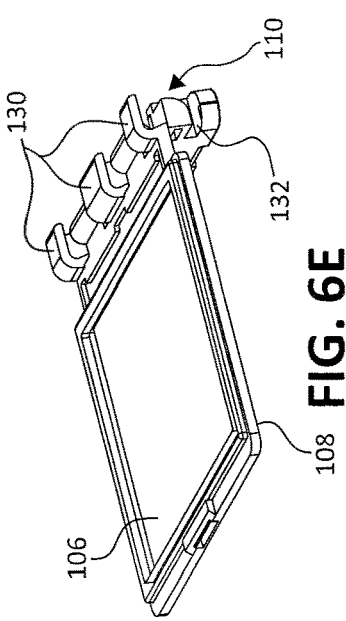

FIGS. 6A-6E are diagrammatic illustrations that show panel 106 in different rotational positions. As can be seen in FIGS. 6A-6E, rotation mechanism 110 and related components include pins 126, sliders 128, catches 130, hinge base 112 and catch slots 132. Panel 106 rotates about pins 126, which are coupled to sliders 128. It should be noted that, in different embodiments, any suitable number of pins 126, sliders 128, catches 130, etc., may be employed. When panel 106 is in the closed position, catches 130 are within catch slots 132. When panel 106 is rotated from the closed position towards the open position, catches 130 are drawn out from catch slots 132 in hinge base 112. FIG. 6B shows panel 106 in a first partially opened position in which catches 130 are almost completely outside catch slots 132. However, as can be seen in FIG. 6B, sliders 128 are still within slots of hinge base 112, and therefore rotation of the panel 106 from the closed position to the first partially opened position takes place with the axis of rotation below an upper surface of the hinge base 112. FIG. 6C shows panel 106 in a second partially opened position, which, as indicated above, is a mid-rotation position of the panel 106. As can be seen in FIG. 6C, in sliders 128 are drawn out of slots in the hinge base 112. In one embodiment, the sliders 128 may be manually drawn out of the slots in the hinge base 112 by pulling the panel 106 upwards after the panel 106 is rotated from the first partially opened position shown in FIG. 6B to the mid-rotation position shown in FIG. 6C. In other embodiments, features may be included in the pins 126 and/or the hinge base 112 to automatically provide an upward force when the panel 106 is rotated from the first partially opened position of FIG. 6B to the mid-rotation position of FIG. 6C. When the pins are in the raised position shown in FIG. 6C, rotation to a third partially opened positon in FIG. 6D and ultimately to the fully opened position shown in FIG. 6E may be carried out without the main body 102 of container 100 (not shown in FIG. 6) acting as a hard stop that limits the panel 106 from rotating.

Figure 7A:
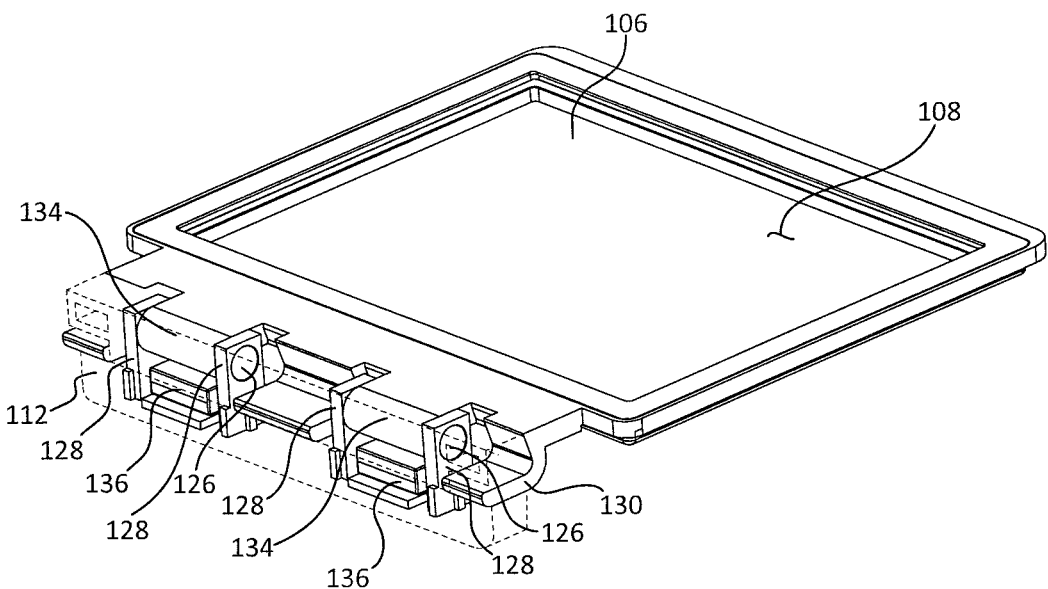
FIG. 7A-7F are perspective views of a panel and a hinge base including a telescoping mechanism in accordance with one embodiment.
Figure 7B:
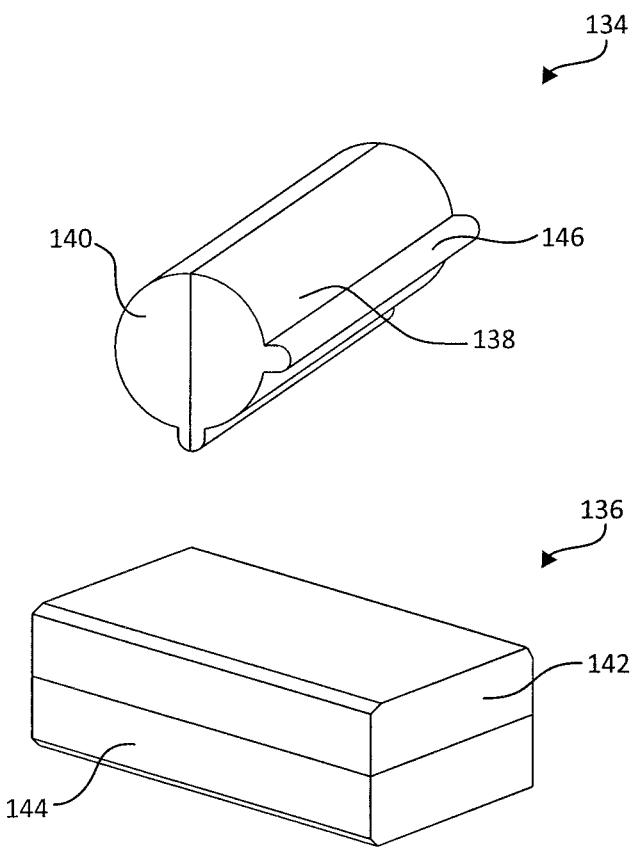

FIG. 7A-7F are perspective views of panel 106 and hinge base 112 including an automatic telescoping mechanism in accordance with one embodiment. In the embodiment of FIGS. 7A-7F, the automatic telescoping mechanism includes magnets that are incorporated into panel 106 and hinge base 112 to cause sliders 128 to automatically telescope upwards when panel 106 is substantially at the mid-rotation position. As can be seen in FIG. 7A, which shows panel 106 in a closed position, panel magnets 134 are included in pins 126, and hinge base magnets 136 are included opposite the panel magnets 134 and within hinge base 112. Polarities of the panel magnets 134 and the hinge base magnets 136 are shown in FIG. 7B. As can be seen in FIG. 7B, panel magnet 134 includes a first pole (e.g., north) 138 and a second pole (e.g., south) 140. Similarly, hinge base magnet 136 includes a first pole (e.g., north) 142 and a second pole (e.g., south) 144. Magnet 134 may include a keying feature 146 that fits into a corresponding slot (not shown) within pin 126 to hold the magnet 134 in place. Panel magnets 134 and hinge base magnets 136 may be installed such that, as panel 106 rotates to the mid-rotation position, like poles of panel magnets 134 and hinge base magnets 136 face each other causing magnetic repulsion, which, in turn, causes slider 128 to telescope upwards (automatically lifting panel 106).

Figure 7C:
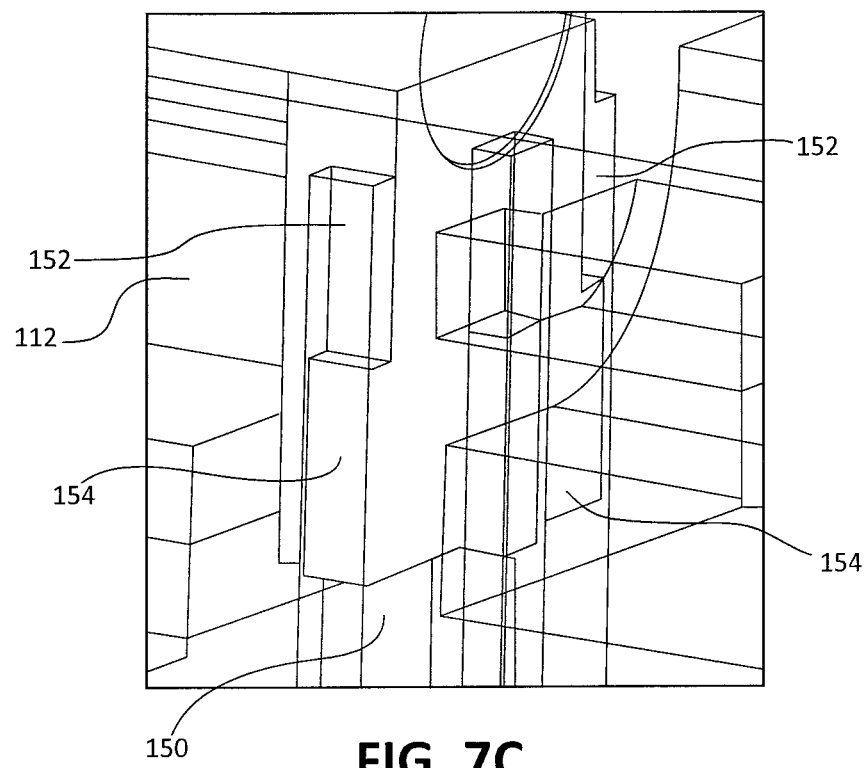
Figure 7D:
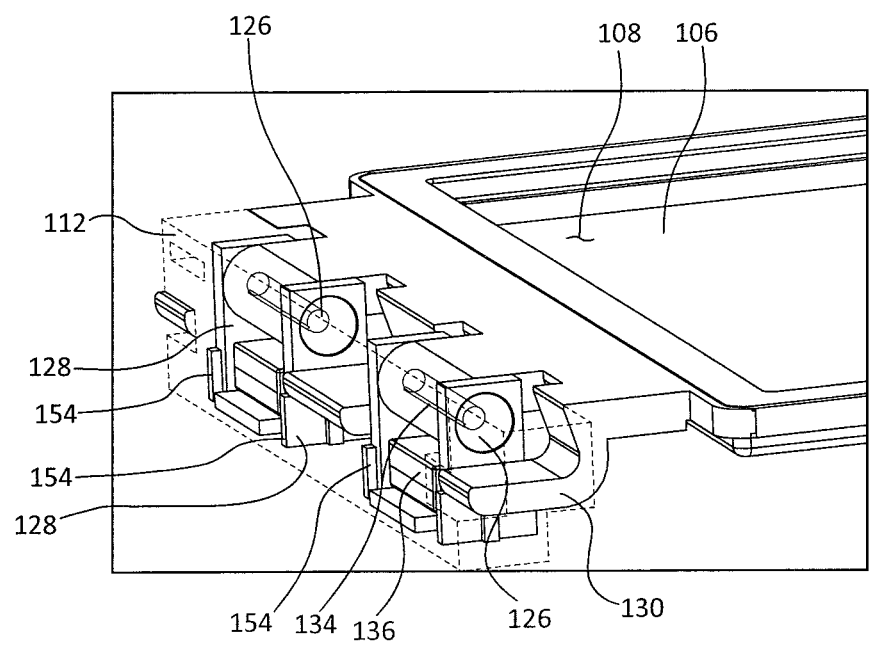

FIG. 7C shows a slot 150 in which slider 128 is movably installed such that sider 128 can move upward and downward within the slot 150. The extent of upward movement of slider 128 is limited by mechanical stops 152 in hinge base 112. An upward movement limit point for slider 128 is reached when slider guides 154 come in contact with mechanical stops 152. FIG. 7D shows slider guides 154 in their lowermost position when panel 106 is closed. Panel magnets 134 and hinge base magnets 136 may aid in keeping the panel 106 in the closed position, although their polarities are perpendicular to one another.

Figure 7E:
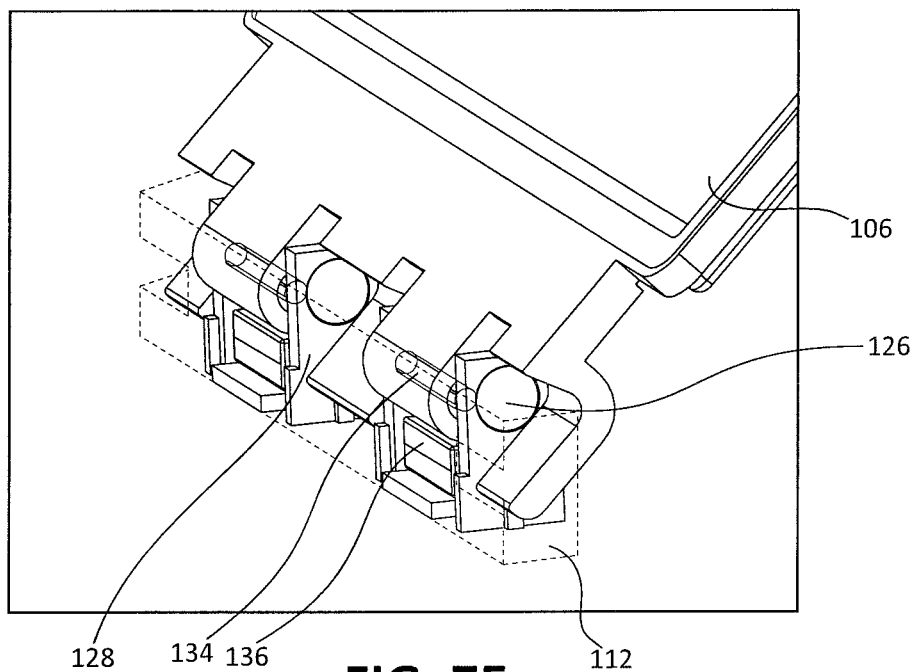
Figure 7F:
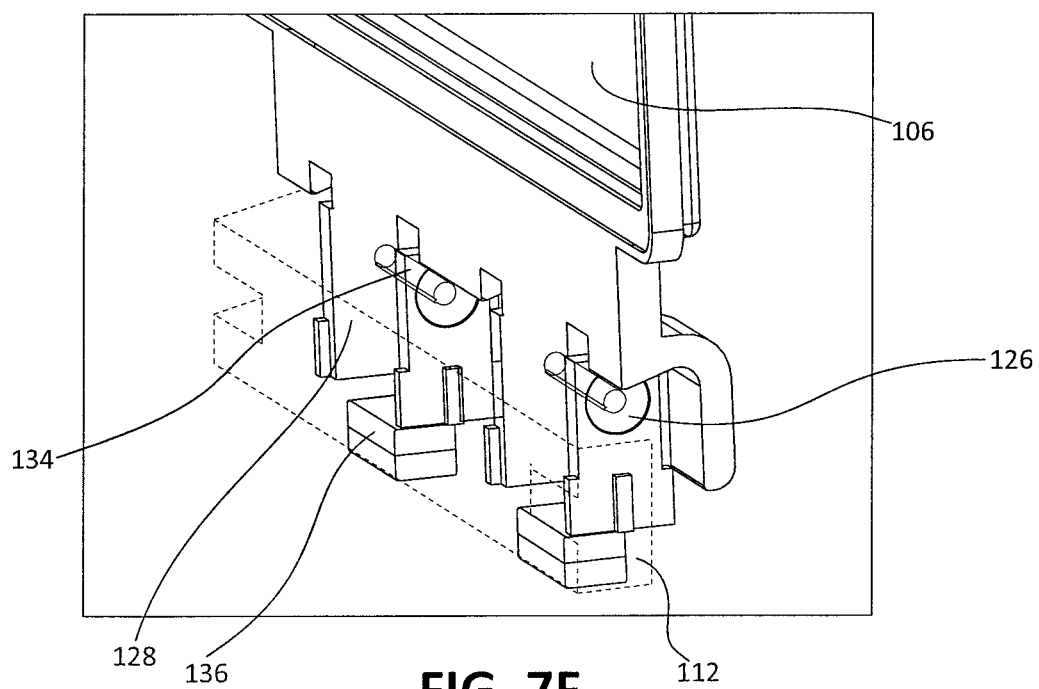

As can be seen in FIGS. 7E and 7F, as the panel 106 rotates about the pin 126 axis to the mid-rotation position, the keyed magnets 134 inside the panel 106 rotate with it. As the polarity of the magnets 134 in the panel 106 and the magnets 136 in the hinge base 112 move to face each other, they begin to interact. When the panel is about 90 degrees open, the panel magnets 134 and hinge base magnets 136 repel each other, as their polarities face in opposite directions. This magnetic repulsion causes the guided sliders 128 that are installed in the slots 150 of the hinge base 112 to telescope outward. Since the panel is attached to the sliders 128 via the pins 126, the panel 106 also moves outward (e.g., away from the hinge base 112).

In the embodiments utilizing magnets described above, panel magnets 134 are included in each of pins 128 with corresponding magnets 136 in hinge base 112. However, in some embodiments, less than all of pins 128 may include magnets 134. For example, in some embodiments, one of pins 128 may include panel magnets 134 and the other pin(s) 128 may not include any panel magnet(s) 134. Such an embodiment would include a single corresponding hinge base magnet 136.

In some embodiments, container 100 may be a shipping container that contains electronic data storage devices integrated into the container 100. Other products or components could be placed into the shipping container as well, such as consumer products that entail the entry of a personal identification number (PIN) or proof of identification (ID) to gain access to the container interior, regulated products, products that may be "activated" upon receipt, or the like.

Figure 8:
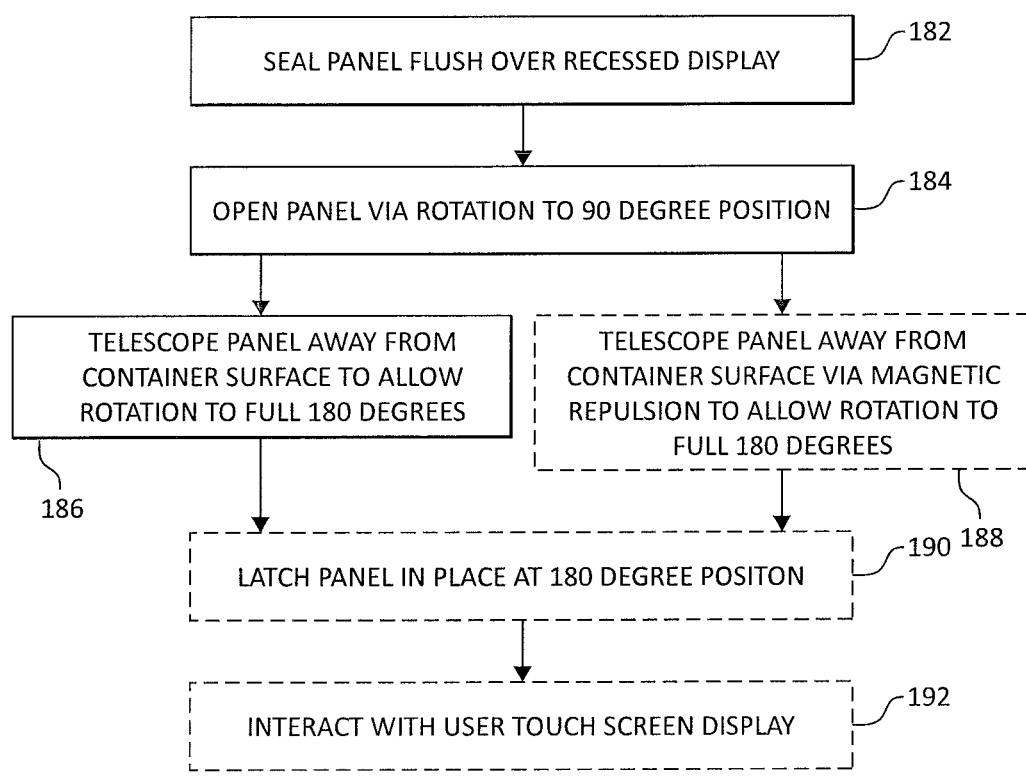
FIG. 8 is a flow diagram of a method embodiment.

FIG. 8 is a flow diagram of a method 180 embodiment. The method includes, at 182, placing or sealing a panel (e.g., panel 106 of FIGS. 4A, 4B and 4C) over a recessed display (e.g., recessed display 116 of FIGS. 4A, 4B and 4C). At 184, the panel is opened via rotation to about a 90 degree position. At 186, the panel is telescoped away from a container surface (e.g., first outer surface 104 of FIGS. 4A, 4B and 4C) to allow rotation to full 180 degrees. In an embodiment that employs magnets (e.g., panel magnets 134 and hinge base magnets 136 of FIGS. 7A-7F), at 188, the panel is telescoped away from the container surface via magnetic repulsion to allow rotation to full 180 degrees. At 190, the panel is latched in place at the 180 degree position. At 192, a user may interact with the recessed display if the recessed display includes a touch screen. It should be noted that that 188-192 are optional.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A container comprising:
   a main body having an outer surface and a recessed surface recessed from the outer surface;
   a panel rotatably mounted to the main body, the panel having a first surface which is flush with the outer surface of the main body and an opposing second surface that faces the recessed surface when the panel is in a closed position; and
   a rotation mechanism having an axis of rotation located between the recessed surface and the outer surface of the main body when the panel is in the closed position, the rotation mechanism configured to enable rotational movement of the panel between the closed position and a fully opened position in which the first surface of the panel is in contact with the first outer surface of the main body, the rotational movement being enabled via a mid-rotation telescoping component configured to enable movement of the axis of rotation of the rotation mechanism outwardly from the outer surface of the main body.

2. The container of claim 1 and wherein the rotation mechanism comprises a hinge base and the mid-rotation telescoping component is configured to move into and out of the hinge base.

3. The container of claim 2 and wherein the mid-rotation telescoping component comprises at least two sliders and a pin connected between the two sliders.

4. The container of claim 3 and wherein the panel is configured to rotate about the pin.

5. The container of claim 3 and wherein the hinge base comprises slider-installation slots in which respective ones of the at least two sliders are movably installed.

6. The container of claim 5 and wherein each of the at least two sliders comprises guides configured for upward and downward movement within the slider-installation slots.

7. The container of claim 6 and wherein the hinge base further comprises mechanical stops above the slider-installation slots, the mechanical stops being configured to limit upward movement of the sliders.

8. The container of claim 5 and wherein the pin comprises a panel magnet and the hinge base comprises a hinge base magnet.

9. The container of claim 8 and wherein like poles of the panel magnet and the hinge base magnet oppose each other in substantially a mid-rotation position of the panel, thereby providing magnetic repulsion that causes movement of the panel away from the first outer surface of the main body.

10. The container of claim 1 and further comprising a recessed display or label that is below the panel when the panel in in the closed position.

11. A container comprising:
a main body having an outer surface and a recess or an opening recessed from the outer surface;
a panel rotatably mounted to the main body, the panel having a first surface and an opposing second surface; and
a rotation mechanism having an axis of rotation located in the recess of the main body when the panel is in a closed position in which the panel covers the recess or the opening in the container, the rotation mechanism configured to enable rotational movement of the panel between the closed position and a fully opened position in which the first surface of the panel is in contact with the outer surface of the main body, the rotational movement being enabled via a mid-rotation telescoping component configured to enable movement of the axis of rotation of the rotation mechanism outwardly from the recess and the outer surface of the main body.

12. The container of claim 11 and wherein the rotation mechanism comprises a hinge base and the mid-rotation telescoping component is configured to move into and out of the hinge base.

13. The container of claim 12 and wherein the mid-rotation telescoping component comprises at least two sliders and a pin connected between the two sliders.

14. The container of claim 13 and wherein the panel is configured to rotate about the pin.

15. The container of claim 13 and wherein the hinge base comprises slider-installation slots in which respective ones of the at least two sliders are movably installed.

16. The container of claim 15 and wherein each of the at least two sliders comprises guides configured for upward and downward movement within the slider-installation slots.

17. A container comprising:
a main body having an outer surface;
a display recessed below the outer surface of the main body; and
a panel rotatably coupled to the main body at an axis of rotation, wherein the panel is located in a closed position over the display when a first surface of the panel is flush with the outer surface of the main body and when an opposing second surface of the panel faces the display;
wherein the panel is configured to open via rotation about the axis of rotation to a 90 degree position from the closed position; and
wherein the axis of rotation is configured to move outwardly from the outer surface of the main body to allow rotation of the panel about the axis of rotation to a full 180 degree position from the closed position.

18. The container of claim 17 and wherein the moving outwardly of the axis of rotation from the outer surface of the main body is carried out via magnetic repulsion.

19. The container of claim 17 and further comprising at least one latch that latches the panel in place at the 180 degree position.

20. The container of claim 17 and wherein the display comprises a touch screen that is accessible for interaction when the panel is in the 180 degree position.

* * * * *

UNITED STATES PATENT AND TRADEMARK OFFICE
CERTIFICATE OF CORRECTION

PATENT NO. : 11,268,311 B1
APPLICATION NO. : 16/369664
DATED : March 8, 2022
INVENTOR(S) : Tong It is certified that error appears in the above-identified patent and that said Letters Patent is hereby corrected as shown below:

In the Claims

Column 6, Claim 1, Line 58 please delete the word "first."

Signed and Sealed this
Seventeenth Day of May, 2022

Katherine Kelly Vidal
*Director of the United States Patent and Trademark Office*